(12) United States Patent
Wu et al.

(10) Patent No.: US 11,508,295 B2
(45) Date of Patent: Nov. 22, 2022

(54) ARRAY SUBSTRATE AND MANUFACTURING METHOD THEREOF, AND DISPLAY DEVICE

(71) Applicants: HEFEI BOE JOINT TECHNOLOGY CO., LTD., Anhui (CN); BOE TECHNOLOGY GROUP CO., LTD., Beijing (CN)

(72) Inventors: Zhongyuan Wu, Beijing (CN); Yongqian Li, Beijing (CN); Can Yuan, Beijing (CN); Xuehuan Feng, Beijing (CN); Zhidong Yuan, Beijing (CN)

(73) Assignees: Hefei BOE Joint Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/309,360

(22) PCT Filed: Aug. 12, 2020

(86) PCT No.: PCT/CN2020/108644
§ 371 (c)(1),
(2) Date: May 21, 2021

(87) PCT Pub. No.: WO2021/068642
PCT Pub. Date: Apr. 15, 2021

(65) Prior Publication Data
US 2022/0020322 A1    Jan. 20, 2022

(30) Foreign Application Priority Data

Oct. 11, 2019 (CN) .......................... 201910963732.3

(51) Int. Cl.
*G09G 3/3225* (2016.01)
*G11C 19/28* (2006.01)

(52) U.S. Cl.
CPC ......... *G09G 3/3225* (2013.01); *G11C 19/287* (2013.01); *G09G 2300/0408* (2013.01); *G09G 2310/0286* (2013.01); *G09G 2310/08* (2013.01)

(58) Field of Classification Search
CPC ... G09G 2300/0408; G09G 2300/0426; G09G 2310/0286
See application file for complete search history.

(56) References Cited

U.S. PATENT DOCUMENTS

2007/0018169 A1  1/2007  Lee et al.
2008/0013029 A1  1/2008  Kim
(Continued)

FOREIGN PATENT DOCUMENTS

CN   102879961 A   1/2013
CN   103293812 A   9/2013
(Continued)

OTHER PUBLICATIONS

CN108803.172Jin Huijun Nov. 13, 2008 (Year: 2008).*
(Continued)

*Primary Examiner* — Van N Chow
(74) *Attorney, Agent, or Firm* — Brooks Kushman P.C.

(57) ABSTRACT

An array substrate and a manufacturing method thereof, and a display device are provided. The array substrate includes: a base substrate, and a GOA circuit, a source electrode IC and PLG wires arranged on the base substrate, and the PLG wires connect the GOA circuit with the source electrode IC. The GOA circuit transmits a GOA signal, and the GOA signal comprises a cascade signal and a non-cascade signal. The PLG wires comprise a first PLG wire group and at least one second PLG wire group, the first PLG wire group transmits the cascade signal, the second PLG wire group transmits the non-cascade signal, a line width of the first
(Continued)

PLG wire group is smaller than that of the second PLG wire group, and the first PLG wire group is located at a side of the second PLG wire group distal to an active area of the base substrate.

16 Claims, 4 Drawing Sheets

(56) References Cited

U.S. PATENT DOCUMENTS

| | | |
|---|---|---|
| 2014/0353844 A1 | 12/2014 | Ma |
| 2015/0042548 A1 | 2/2015 | Liu et al. |
| 2015/0108480 A1 | 4/2015 | Xu et al. |
| 2015/0194090 A1 | 7/2015 | Lin et al. |
| 2016/0293631 A1 | 10/2016 | Sun et al. |
| 2018/0033392 A1 | 2/2018 | Xie |
| 2018/0061346 A1* | 3/2018 | Zhao .................... G09G 3/3677 |
| 2021/0201804 A1 | 7/2021 | Feng et al. |
| 2022/0020322 A1* | 1/2022 | Wu ........................ G09G 3/20 |

FOREIGN PATENT DOCUMENTS

| | | |
|---|---|---|
| CN | 103400555 A | 11/2013 |
| CN | 103903547 A | 7/2014 |
| CN | 104699349 A | 6/2015 |
| CN | 105427823 A | 3/2016 |
| CN | 106226963 A | 12/2016 |
| CN | 107121855 A | 9/2017 |
| CN | 107992229 A | 5/2018 |
| CN | 108803172 A | 11/2018 |
| CN | 109166527 A | 1/2019 |

OTHER PUBLICATIONS

CN106226963 Mao Dalong Dec. 14, 2016 (Year: 2016).*
First Office Action for Chinese Application No. 201910963732.3, dated Aug. 4, 2021, 10 Pages.
International Search Report and Written Opinion for Application No. PCT/CN2020/108644, dated Oct. 29, 2020, 9 Pages.

* cited by examiner

ARRAY SUBSTRATE AND MANUFACTURING METHOD THEREOF, AND DISPLAY DEVICE

CROSS-REFERENCE TO RELATED APPLICATIONS

This application is the U.S. national phase of PCT Application No. PCT/CN2020/108644 filed on Aug. 12, 2020, which claims priority to Chinese Patent Application No. 201910963732.3 filed on Oct. 11, 2019, which are incorporated herein by reference in their entireties.

TECHNICAL FIELD

Embodiments of the present disclosure relate to the technical field of display, in particular to an array substrate and a manufacturing method thereof, and a display device.

BACKGROUND

In the display industry, in order to reduce the material cost of a display device and implement the narrow frame design of the display device, more gate driving circuits adopt the Gate driver On Array (GOA) technology, that is, the gate driving circuit is integrated into an array substrate.

The GOA circuit may be connected with a source Integrated Circuit (IC) by means of a Propel Link Gate (PLG) wire to receive signals output by the source IC. When the display device is a high Pixels Per Inch (PPI) display device, the number of the PLG wires is large, which occupies a large area in a layout area, hinders the implementation of the narrow frame.

SUMMARY

The embodiments of the present disclosure provide an array substrate and a manufacturing method thereof, and a display device, which are used for solving a problem in related art where the PLG wires occupy a large area in a layout area, and hinder the implementation of the narrow frame.

In order to solve the above technical problems, the present disclosure is implemented as follows.

In a first aspect, an embodiment of the present disclosure provides an array substrate including a base substrate, a GOA circuit, a source electrode integrated circuit and PLG wires, wherein the GOA circuit, the source electrode integrated circuit and the PLG wires are arranged in a peripheral area of the base substrate, and the PLG wires are configured for connecting the GOA circuit with the source electrode integrated circuit; the GOA circuit is configured for transmitting a GOA signal, and the GOA signal includes a cascade signal and a non-cascade signal; the PLG wires include a first PLG wire group and at least one second PLG wire group, wherein the first PLG wire group is configured for transmitting the cascade signal, the second PLG wire group is configured for transmitting the non-cascade signal, a line width of the first PLG wire group is smaller than a line width of the second PLG wire group, and the first PLG wire group is located at a side of the second PLG wire group that is distal to an active area of the base substrate.

Optionally, the line widths of the PLG wires in a same group are same, the line widths of the PLG wires in different groups are different, and the PLG wires in different groups are configured for transmitting the GOA signals of different types.

Optionally, the PLG wires in the same group are arranged in the same area, and the PLG wires in different groups are arranged in different areas.

Optionally, the non-cascade signal includes: a driving signal and a control signal; there is one second PLG wire group, the second PLG wire group includes a second PLG wire and a third PLG wire, the second PLG wire is configured for transmitting the driving signal, and the third PLG wire is configured for transmitting the control signal.

Optionally, the PLG wires in a same group are configured for transmitting the GOA signals of a same type.

Optionally, the non-cascade signal includes: a driving signal and a control signal; there are two second PLG wire groups, wherein one of the second PLG wire groups includes a second PLG wire, the other one of the second PLG wire groups includes a third PLG wire, the second PLG wire is configured for transmitting the driving signal, and the third PLG wire is configured for transmitting the control signal.

Optionally, a line width of the third PLG wire is smaller than a line width of the second PLG wire.

Optionally, the third PLG wire is located at a side of the second PLG wire proximate to the active area.

Optionally, the GOA circuit includes a plurality of cascaded shift register units and a blanking input subunit; each of the cascaded shift register units includes a first subunit and a second subunit, the first subunit includes a first input circuit and a first output circuit, the first input circuit is configured for controlling an electric level at a first node in response to a first input signal, and the first output circuit is configured for outputting a shift signal and a first output signal under control of the electric level at the first node, and the second subunit includes a second input circuit and a second output circuit, the second input circuit is configured for controlling an electric level at a second node in response to the first input signal, and the second output circuit is configured for outputting a second output signal under control of the electric level at the second node; the blanking input subunit includes: a common input circuit, a first transmission circuit and a second transmission circuit; and the common input circuit is configured for controlling an electric level at a third node in response to a selection control signal; the first transmission circuit is electrically connected with the first node and the third node, and is configured for controlling the electric level at the first node under control of the electric level at the third node or a first transmission signal; and the second transmission circuit is electrically connected with the second node and the third node, and is configured for controlling the electric level at the second node under the control of a second transmission signal or the electric level at the third node.

Optionally, the cascade signal includes: a fourth clock signal; the GOA circuit includes: a fifth sub-clock signal line, a seventh sub-clock signal line and a ninth sub-clock signal line; a PLG wire in the first PLG wire group is a first PLG wire; the fifth sub-clock signal line is connected with a second subunit in a $(3n-2)^{th}$-stage shift register unit, and is connected with the first PLG wire, to transmit the fourth clock signal; the seventh sub-clock signal line is connected with a second subunit in a $(3n-1)^{th}$-stage shift register unit, and is connected with the first PLG wire, to transmit the fourth clock signal; the ninth sub-clock signal line is connected with a second subunit in a $3n^{th}$-stage shift register unit, and is connected with the first PLG wire, to transmit the fourth clock signal, wherein n is an integer greater than zero.

Optionally, the driving signal includes: a first clock signal, a second clock signal and a third clock signal; the GOA circuit includes: a first sub-clock signal line, a second sub-clock signal line, a third sub-clock signal line, a fourth sub-clock signal line, a sixth sub-clock signal line, an eighth sub-clock signal line and a twelfth sub-clock signal line; when there are two second PLG wire groups, a PLG wire in one of the second PLG wire groups is the second PLG wire; the first sub-clock signal line is connected with a first subunit in a $(3n-2)^{th}$-stage shift register unit, and is connected with the second PLG wire, to transmit the second clock signal; the second sub-clock signal line is connected with a first subunit in a (3n-1)-stage shift register unit, and is connected with the second PLG wire, to transmit the second clock signal; the third sub-clock signal line is connected with a first subunit in a 3e-stage shift register unit, and is connected with the second PLG wire, to transmit the second clock signal; the fourth sub-clock signal line is connected with the first subunit in the $(3n-2)^{th}$-stage shift register unit, and is connected with the second PLG wire, to transmit the third clock signal; the sixth sub-clock signal line is connected with the first subunit in the $(3n-1)^{t}$-stage shift register unit, and is connected with the second PLG wire, to transmit the third clock signal; the eighth sub-clock signal line is connected with the first subunit in the 3e-stage shift register unit, and is connected with the second PLG wire, to transmit the third clock signal; the twelfth sub-clock signal line is connected with the first subunit and the second subunit in the shift register unit of each stage, and the common input circuit, and is connected with the second PLG wire, to transmit the first clock signal; n is an integer greater than zero.

Optionally, the control signal includes: a global reset signal, a selection control signal, a second voltage, a third voltage and a first input signal; the GOA circuit includes: a tenth sub-clock signal line, an eleventh sub-clock signal line, a thirteenth sub-clock signal line, a fourteenth sub-clock signal line and a fifteenth sub-clock signal line; when there are two second PLG wire groups, a PLG wire in the other one of the second PLG wire groups is the third PLG wire; the tenth sub-clock signal line is connected with the first subunit and the second subunit, and is connected with the third PLG wire, to transmit the global reset signal; the eleventh sub-clock signal line is connected with the common input circuit, and is connected with the third PLG wire, to transmit the selection control signal; the thirteenth sub-clock signal line is connected with the first subunit, and is connected with the third PLG wire, to transmit the second voltage; the fourteenth sub-clock signal line is connected with the second subunit, and is connected with the third PLG wire, to transmit the third voltage; the fifteenth sub-clock signal line is connected with the first subunit and the second subunit, and is connected with the third PLG wire, to transmit the first input signal.

In a second aspect, an embodiment of the present disclosure provides a method for manufacturing an array substrate, including: providing a base substrate; and forming a GOA circuit and PLG wires in a peripheral area of the base substrate, wherein the PLG wires are configured for connecting the GOA circuit with the source electrode integrated circuit, the PLG wires include a first PLG wire group and at least one second PLG wire group, and the first PLG wire group is configured for transmitting a cascade signal, and the second PLG wire group is configured for transmitting a non-cascade signal, a line width of the first PLG wire group is smaller than a line width of the second PLG wire group, and the first PLG wire group is located at a side of the second PLG wire group that is distal to an active area of the base substrate.

In a third aspect, an embodiment of the present disclosure provides a display device including the above-mentioned array substrate.

BRIEF DESCRIPTION OF THE DRAWINGS

Various other advantages and benefits will become apparent to a person skilled in the art upon reading the following detailed description of the preferred embodiments. The drawings are only for purposes of illustrating the preferred embodiments and are not to be construed as limiting the present disclosure. Like reference numerals denote like parts throughout the drawings. In the drawings.

DETAILED DESCRIPTION

The technical solutions of the embodiments of the present disclosure will now be described more fully hereinafter with reference to the accompanying drawings, in which some, but not all embodiments of the present disclosure are described. Based on the embodiments in the present disclosure, all other embodiments obtained by a person of ordinary skill in the art without inventive effort are within the scope of protection of the present disclosure.

Figure 1:
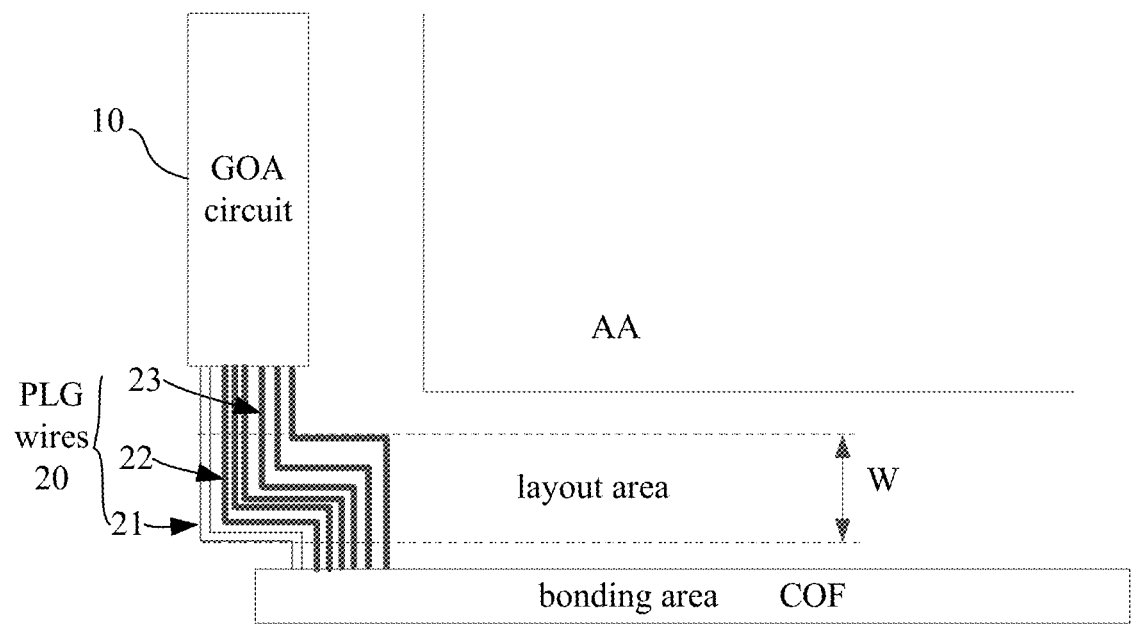
FIG. 1 is a schematic structural diagram of a display substrate according to an embodiment of the present disclosure.
Figure 2:
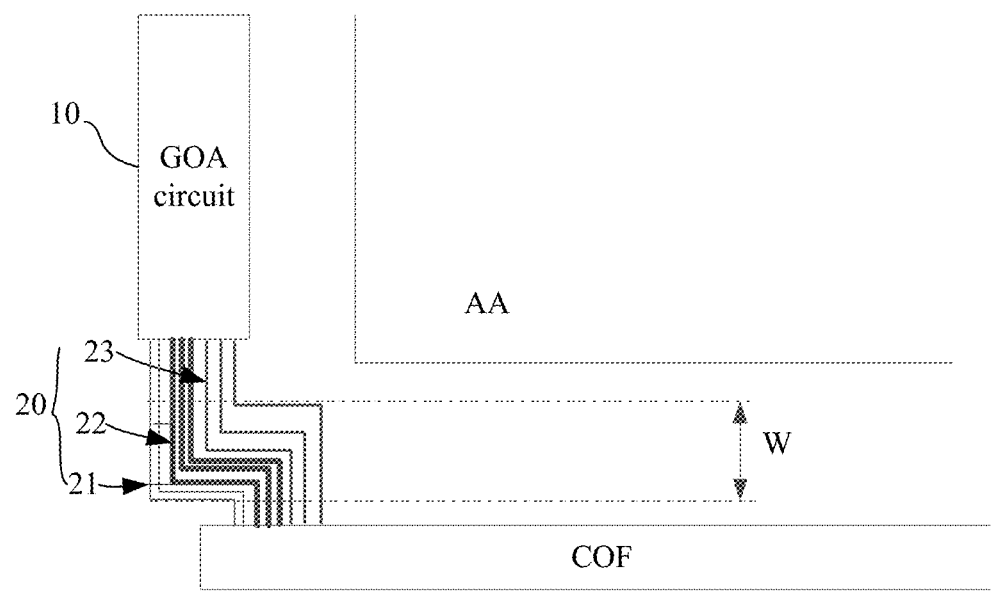
FIG. 2 is a schematic structural diagram of a display substrate according to another embodiment of the present disclosure.

Referring to FIGS. 1 and 2, embodiments of the present disclosure provide an array substrate including a base substrate (not shown), and a GOA circuit 10, a source electrode Integrated Circuit (IC), and PLG wires 20, wherein the GOA circuit 10, the source electrode IC, and PLG wires 20 are arranged in a peripheral area of the base substrate, wherein the PLG wires are configured for connecting the GOA circuit 10 and the source electrode IC, the PLG wires 20 are divided into at least two groups, line widths of the PLG wires 20 in the same group are the same, the line widths of the PLG wires 20 in different groups are different, the PLG wires in different groups are configured for transmitting GOA signals of different types, and the GOA signal includes a cascade signal and a non-cascade signal; the at least two groups include a first PLG wire group and at least one second PLG wire group, the first PLG wire group is configured for transmitting the cascade signal, the second PLG wire group is configured for transmitting the non-cascade signal, a line width of the first PLG wire group is smaller than a line width of the second PLG wire group, and the first PLG wire group is located at a side of the second PLG wire group distal to an active area of the base substrate.

In embodiments of the present disclosure, the base substrate is divided into the Active Area (AA) and the peripheral area located at a periphery of the active area, wherein the peripheral area includes a GOA circuit area, a layout area and a bonding area, and the layout area is an area between two dotted lines in FIGS. 1 and 2, the bonding area is an area where a Chip On Film (COF, which is a grain soft film packaging technology for fixing a source electrode IC onto a flexible circuit board) is arranged in FIGS. 1 and 2, the boding area includes a bonding pad, and the PLG wires are connected with the bonding pad, and is bonded to the COF through the bonding pad.

In the embodiment shown in FIG. 1, the PLG wires 20 are divided into two groups: the first PLG wire group and one second PLG wire group, wherein the first PLG wire group includes a plurality of first PLG wires 21 configured for transmitting the cascade signal, the second PLG wire group includes a plurality of second PLG wires 22 and a plurality of third PLG wires 23, the second PLG wires 22 are configured for transmitting a driving signal, and the third PLG wires 23 are configured for transmitting a control signal, a line width of the first PLG wire 21 is smaller than line widths of the second PLG wire 22 and the third PLG wire 23. In a specific implementation, the line width of the first PLG wire 21 may be designed to be small, so that a width W of the PLG wire in the layout area can be reduced, and thus an entirety of the peripheral area can be reduced, and a narrow frame can be realized accordingly.

In the embodiment shown in FIG. 2, the PLG wires 20 may be divided into three groups: the first PLG wire group and two second PLG wire groups, wherein the first PLG wire group includes a plurality of first PLG wires 21 configured for transmitting the cascade signal, one of the second PLG wire groups includes a plurality of second PLG wires 22 configured for transmitting a driving signal, and the other second PLG wire group includes a plurality of third PLG wires 23 configured for transmitting a control signal, a line width of the first PLG wire 21 is smaller than each of line widths of the second PLG wire 22 and the third PLG wire 23, the line width of the second PLG wire 22 is larger than the line width of the third PLG wire 23, and the line width of the third PLG wire 23 is larger than the line width of the first PLG wire 21. In a specific design, the line widths of a part of the PLG wires (for example, the first PLG wires 21) may be designed to be small, so that a width W of the PLG wire in the layout area can be reduced, and thus an entirety of the peripheral area can be reduced, and the narrow frame can be realized accordingly. In the embodiments of the present disclosure, since a current of the cascade signal is small, the line width of the PLG wire for transmitting the cascade signal can be small, and the driving signal requires a Resistance Capacitance (RC) to be as small as possible, so that the line width of the PLG wire for transmitting the driving signal needs to be set to be large.

In the embodiments of the present disclosure, the PLG wires configured for connecting the GOA circuit and the source IC are divided into at least two groups, the line widths of the PLG wires in the same group are the same, and the line widths of the PLG wires in different groups are different, so that the line widths of the PLG wires of some groups can be set to be small, so as to reduce an area occupied by the PLG wires, and realize the narrow frame.

In addition, the PLG wires in different groups are configured for transmitting different types of GOA signals, the PLG wires configured for transmitting the cascade signal are set as one group. The line width of the PLG wire configured for transmitting the cascade signal can be set to be minimum because a current of the cascade signal is small; at the same time, the PLG wires configured for transmitting the cascade signal may be arranged at a location far away from the active area because the load requirement of the PLG wire configured for transmitting the cascade signal is low.

In some embodiments of the present disclosure, optionally, the PLG wires in the same group are located in the same area, and the PLG wires in different groups are located in different areas. That is, as shown in FIGS. 1 and 2, the PLG wires in the same group are arranged next to one another, to facilitate the formation of the PLG wires. It should be noted that, in other embodiments of the present disclosure, it is not precluded that the PLG wires in the same group are arranged in different areas, i.e. the PLG wires in the same group may alternatively not be arranged next to one another.

In some embodiments of the present disclosure, the PLG wires in the same group (when the number of the second wiring group is one) may transmit the GOA signals of different types (the embodiment shown in FIG. 1). In some embodiments of the present disclosure, the PLG wires in the same group are also configured for transmitting the GOA signals of the same type (the embodiment shown in FIG. 2) to satisfy different GOA signal requirements.

Since the control signal consists essentially of a low frequency signal and a direct current (DC) signal, the control signal is typically placed inside the GOA circuit, i.e. proximate to the active area, in view of a low level of interference with other signals, thus avoiding the generation of noise with other signals. The cascade signal is used to generate a cascade output for setting or resetting other GOA units, and because of the low load requirement of the cascade signal, the cascade signal is typically placed outside the GOA circuit; and the driving signal is used to generate pixel circuit driving in the active area, and because the drive signal is directly related to the uniformity of the active area, the drive signal is placed in the middle, so that the noise is avoided to the maximum extent and the influence of RC is reduced to a certain extent. That is, in the embodiments of the present disclosure, the third PLG wire is arranged adjacent to the active area of the base substrate; the first PLG wire is arranged far away from the active area of the base substrate; and the second PLG wire is arranged between the first PLG wire and the third PLG wire.

Figure 3:
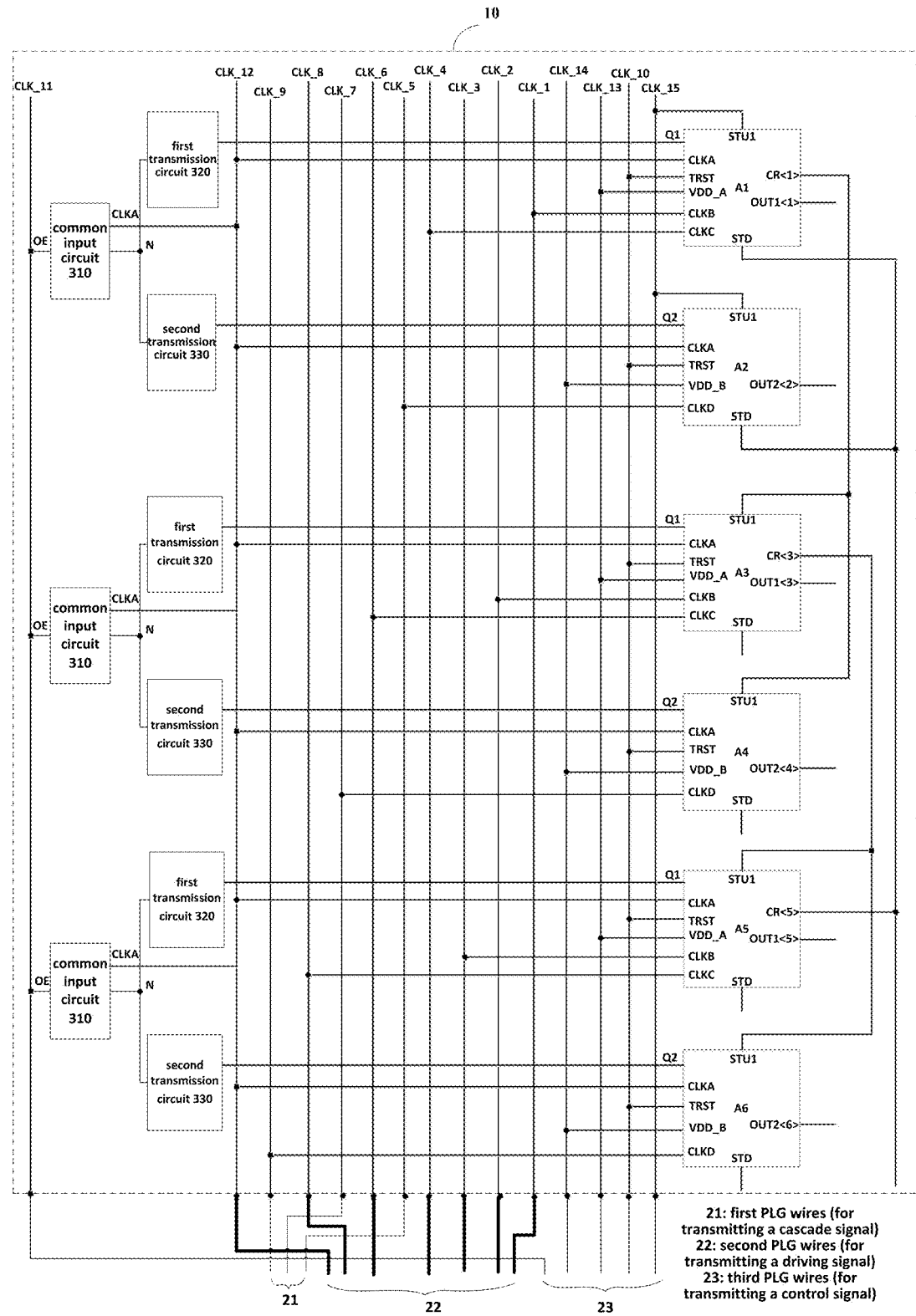
FIG. 3 is a schematic structural diagram of a display substrate according to still another embodiment of the present disclosure.

An embodiment of the present disclosure further provides a display substrate, as shown in FIG. 3, the display substrate includes a GOA circuit 10 and PLG wires, wherein the GOA circuit 10 includes a plurality of cascaded shift register units and a blanking input subunit, the blanking input subunit includes: a common input circuit 310, a first transmission circuit 320 and a second transmission circuit 330.

Figure 4:
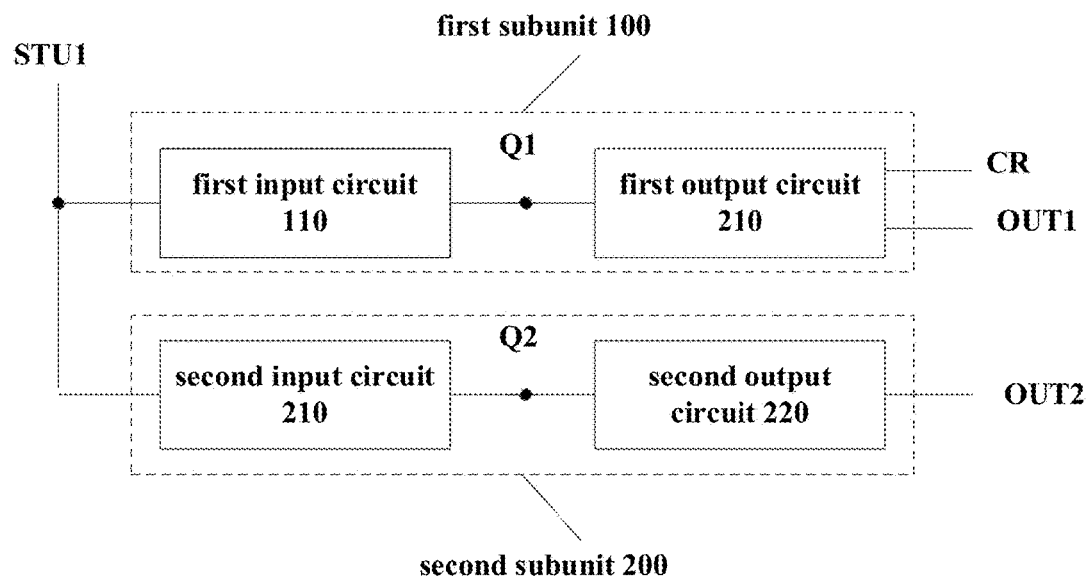
FIG. 4 is a schematic structural diagram of a shift register unit according to an embodiment of the present disclosure.

Referring to FIG. 4, each shift register unit includes a first subunit 100 and a second subunit 200, wherein the first subunit 100 includes a first input circuit 110 and a first output circuit 120, the first input circuit 110 is configured for controlling an electric level at a first node Q1 in response to a first input signal STU1, and the first output circuit 120 is configured for outputting a shift signal CR and a first output signal OUT1 under control of the electric level at the first node Q1, and the second subunit 200 includes a second input circuit 210 and a second output circuit 220, the second input circuit 210 is configured for controlling an electric level at the second node Q2 in response to the first input signal STU1, and the second output circuit 220 is configured for outputting a second output signal OUT2 under control of the electric level at the second node Q2.

The common input circuit 310 is configured for controlling an electric level at a third node N in response to a selection control signal OE; the first transmission circuit 320 is electrically connected with the first node Q1 and the third node N, and is configured for controlling the electric level at the first node Q1 under control of the electric level at the third node N or a first transmission signal STU1; and the second transmission circuit 330 is electrically connected with the second node Q2 and the third node N, and is configured for controlling the electric level at the second node Q2 under the control of the electric level at the third node N or a second transmission signal.

The reference signs A1, A2, A3, A4, A5 and A6 in FIG. 3 denote the subunits in the shift register units, for example, the reference signs A1, A3 and A5 denote the first subunits in the three shift register units, respectively, and the reference signs A2, A4 and A6 denote the second subunits in the three shift register units, respectively.

For example, as shown in FIG. 3, each shift register unit includes the first subunit and the second subunit to output the first output signal OUT1 and the second output signal OUT2, respectively. When the GOA circuit 10 is used to drive a display panel, each of the first output signal OUT1 and the second output signal OUT2 may drive a respective one row of sub-pixel units in the display panel. For example, A1, A2, A3, A4, A5, and A6 can drive a first row of sub-pixel units, a second row of sub-pixel units, a third row of sub-pixel units, a fourth row of sub-pixel units, a fifth row of sub-pixel units, and a sixth row of sub-pixel units of the display panel, respectively.

In the following, signal lines in the GOA circuit 10 will be described by taking the GOA circuit 10 shown in FIG. 3 as an example.

As shown in FIG. 3, the GOA circuit 10 includes a first sub-clock signal line CLK_1, a second sub-clock signal line CLK_2 and a third sub-clock signal line CLK_3. A first subunit in a $(3n-2)^{th}$-stage shift register unit is connected with the first sub-clock signal line CLK_1 to receive a second clock signal CLKB of the $(3n-2)^{th}$-stage shift register unit; a first subunit in a $(3n-1)^{th}$-stage shift register unit is connected with the second sub-clock signal line CLK_2 to receive a second clock signal CLKB of the $(3n-1)^{th}$-stage shift register unit; a first subunit in a $3n^{th}$-stage shift register unit is connected with the third sub-clock signal line CLK_3 to receive a second clock signal CLKB of the $3n^{th}$-stage shift register unit; and n is an integer greater than zero.

As described above, when the shift register units are cascaded, only the second clock signal CLKB needs to be sequentially provided to the first subunit in the shift register unit of each stage, and the second clock signal CLKB may be output as the shift signal CR to implement a scan shift.

As shown in FIG. 3, the GOA circuit 10 further includes a fourth sub-clock signal line CLK_4, a fifth sub-clock signal line CLK_5, a sixth sub-clock signal line CLK_6, a seventh sub-clock signal line CLK_7, an eighth sub-clock signal line CLK_8 and a ninth sub-clock signal line CLK_9.

The first subunit in the $(3n-2)^{th}$-stage shift register unit is connected with the fourth sub-clock signal line CLK_4 to receive a third clock signal CLKC of the $(3n-2)^{th}$-stage shift register unit, and a second subunit in the $(3n-2)^{th}$-stage shift register unit is connected with the fifth sub-clock signal line CLK_5 to receive a fourth clock signal CLKD of the $(3n-2)^{th}$-stage shift register unit.

The first subunit in the $(3n-1)^{th}$-stage shift register unit is connected with the sixth sub-clock signal line CLK_6 to receive a third clock signal CLKC of the $(3n-1)^{th}$-stage shift register unit, and a second subunit in the $(3n-1)^{th}$-stage shift register unit is connected with the seventh sub-clock signal line CLK_7 to receive a fourth clock signal CLKD of the $(3n-1)^{th}$-stage shift register unit.

The first subunit in the $3n^{th}$-stage shift register unit is connected with the eighth sub-clock signal line CLK_8 to receive a third clock signal CLKC of the $3n^{th}$-stage shift register unit, and a second subunit in the $3n^{th}$-stage shift register unit is connected with the ninth sub-clock signal line CLK_9 to receive a fourth clock signal CLKD of the $3n^{th}$-stage shift register unit.

As described above, the driving signals are provided to the shift register unit of each stage in a row-by-row output manner through the six clock signal lines including the fourth sub-clock signal line CLK_4, the fifth sub-clock signal line CLK_5, the sixth sub-clock signal line CLK_6, the seventh sub-clock signal line CLK_7, the eighth sub-clock signal line CLK_8 and the ninth sub-clock signal line CLK_9. That is, the GOA circuit 10 provided by the embodiments of the present disclosure may use a clock signal of 6CLK, so that waveforms of the driving signals output by the GOA circuit 10 can be overlapped, for example, the pre-charge time of each row of sub-pixel units can be increased, so that the gate driving circuit can be suitable for high-frequency scanning display. In the embodiments of the present disclosure, it does not limit a type of the clock signal, for example, a clock signal of 8CLK, 10CLK, etc. may alternatively be used.

As shown in FIG. 3, the GOA circuit 10 further includes a tenth sub-clock signal line CLK_10, an eleventh sub-clock signal line CLK_11 and a twelfth sub-clock signal line CLK_12.

For example, the first subunit and the second subunit in the shift register unit of each stage are both connected with the tenth sub-clock signal line CLK_10 to receive a global reset signal TRST. The common input circuits 310 in the shift register unit of each stage is connected with the eleventh sub-clock signal line CLK_11 to receive a selection control signal OE. The first subunit, and the second subunit in the shift register unit of each stage, as well as the common input circuit 310 are all connected with the twelfth sub-clock signal line CLK_12 to receive a first clock signal CLKA.

As shown in FIG. 3, the GOA circuit 10 further includes a thirteenth sub-clock signal line CLK_13 and a fourteenth sub-clock signal line CLK_14.

For example, the first subunit in the shift register unit of each stage is connected with the thirteenth sub-clock signal line CLK_13 to receive a second voltage VDD_A; and the second subunit in the shift register unit of each stage is connected with the fourteenth sub-clock signal line CLK_14 to receive a third voltage VDD_B.

As shown in FIG. 3, the GOA circuit 10 further includes a fifteenth sub-clock signal line CLK_15, and a first subunit and a second subunit in a first-stage shift register unit are connected with the fifteenth sub-clock signal line CLK_15 to receive the first input signal STU1.

As shown in FIG. 3, in addition to the first-stage shift register unit, a first subunit and a second subunit in a shift register unit of another stage are connected with a first subunit in a shift register unit of a previous stage to receive the shift signal CR and use the shift signal CR as the first input signal STU1. The first subunit and the second subunit in the shift register units of a stage apart from the shift register units of the last two stages are connected with first subunits in the shift register units of subsequent two stages to receive the shift signal CR and use the shift signal CR as a display reset signal STD.

It should be noted that the cascading relationship shown in FIG. 3 is merely an example, and according to the present disclosure, other cascading manners may be adopted in accordance with practical requirements.

In some embodiments of the present disclosure, the cascade signal includes: the fourth clock signal; the GOA circuit includes: the fifth sub-clock signal line, the seventh sub-clock signal line and the ninth sub-clock signal line; the PLG wires in the first PLG wire group are the first PLG wires 21; the fifth sub-clock signal line is connected with the second subunit in the $(3n-2)^{th}$-stage shift register unit, and is connected with the first PLG wire 21 to transmit the fourth clock signal; the seventh sub-clock signal line is connected with the second subunit in the $(3n-1)^{th}$-stage shift register unit, and is connected with the first PLG wire 21 to transmit the fourth clock signal; and the ninth sub-clock signal line is connected with the second subunit in the $3n^{th}$-stage shift register unit, and is connected with the first PLG wire 21 to transmit the fourth clock signal, and n is an integer greater than zero.

In some embodiments of the present disclosure, the driving signal includes: the first clock signal, the second clock signal and the third clock signal; the GOA circuit includes: the first sub-clock signal line, the second sub-clock signal line, the third sub-clock signal line, the fourth sub-clock signal line, the sixth sub-clock signal line, the eighth sub-clock signal line and the twelfth sub-clock signal line; when the number of the second PLG wire groups is two, the PLG wire in one of the second PLG wire groups are the second PLG wire 22; the first sub-clock signal line is connected with the first subunit in the $(3n-2)^{th}$-stage shift register unit, and is connected with the second PLG wire 22 to transmit the second clock signal; the second sub-clock signal line is connected with the first subunit in the $(3n-1)^{th}$-stage shift register unit, and is connected with the second PLG wire 22 to transmit the second clock signal; the third sub-clock signal line is connected with the first subunit in the $3n^{th}$-stage shift register unit, and is connected with the second PLG wire 22 to transmit the second clock signal; the fourth sub-clock signal line is connected with the first subunit in the $(3n-2)^{th}$-stage shift register unit, and is connected with the second PLG wire to transmit the third clock signal; the sixth sub-clock signal line is connected with the first subunit in the $(3n-1)^{th}$-stage shift register unit, and is connected with the second PLG wire 22 to transmit the third clock signal; the eighth sub-clock signal line is connected with the first subunit in the $3n^{th}$-stage shift register unit, and is connected with the second PLG wire 22 to transmit the third clock signal; the twelfth sub-clock signal line is connected with the first subunit and the second subunit in the shift register unit of each stage, as well as the common input circuit, and is connected with the second PLG wire 22 to transmit the first clock signal; and n is an integer greater than zero.

In some embodiments of the present disclosure, the control signal includes: the global reset signal, the selection control signal, the second voltage, the third voltage and the first input signal; the GOA circuit includes: the tenth sub-clock signal line, the eleventh sub-clock signal line, the thirteenth sub-clock signal line, the fourteenth sub-clock signal line and the fifteenth sub-clock signal line; when the number of the second PLG wire groups is two, the PLG wire in the other one of the second PLG wire groups is the third PLG wire 23; the tenth sub-clock signal line is connected with the first subunit and the second subunit, and is connected with the third PLG wire 23 to transmit the global reset signal; the eleventh sub-clock signal line is connected with the common input circuit, and is connected with the third PLG wire 23 to transmit the selection control signal; the thirteenth sub-clock signal line is connected with the first subunit, and is connected with the third PLG wire 23 to transmit the second voltage; the fourteenth sub-clock signal line is connected with the second subunit, and is connected with the third PLG wire 23 to transmit the third voltage; and the fifteenth sub-clock signal line is connected with the first subunit and the second subunit, and is connected with the third PLG wire 23 to transmit the first input signal.

In the embodiment shown in FIG. 3, the PLG wires are divided into the following three groups: the first PLG wire group, which is configured for transmitting the cascade signal; two second PLG wire groups, wherein one of the two second PLG wire groups is configured for transmitting the driving signal, and the other one of the two second PLG wire groups is configured for transmitting the control signal.

The line width of the first PLG wire (connected with CLK_9, CLK_7 and CLK_5) configured for transmitting the cascading signal is less than the line width of the second PLG wire (connected with CLK_12, CLK_8, CLK_6, CLK_4, CLK_3, CLK_2 and CLK_1) configured for transmitting the drive signal, the line width of the second PLG wire configured for transmitting the driving signal is greater than the line width of the third PLG wire (connected with CLK_11, CLK_14, CLK_13, CLK_10 and CLK_15) configured for transmitting the control signal.

Figure 5A:
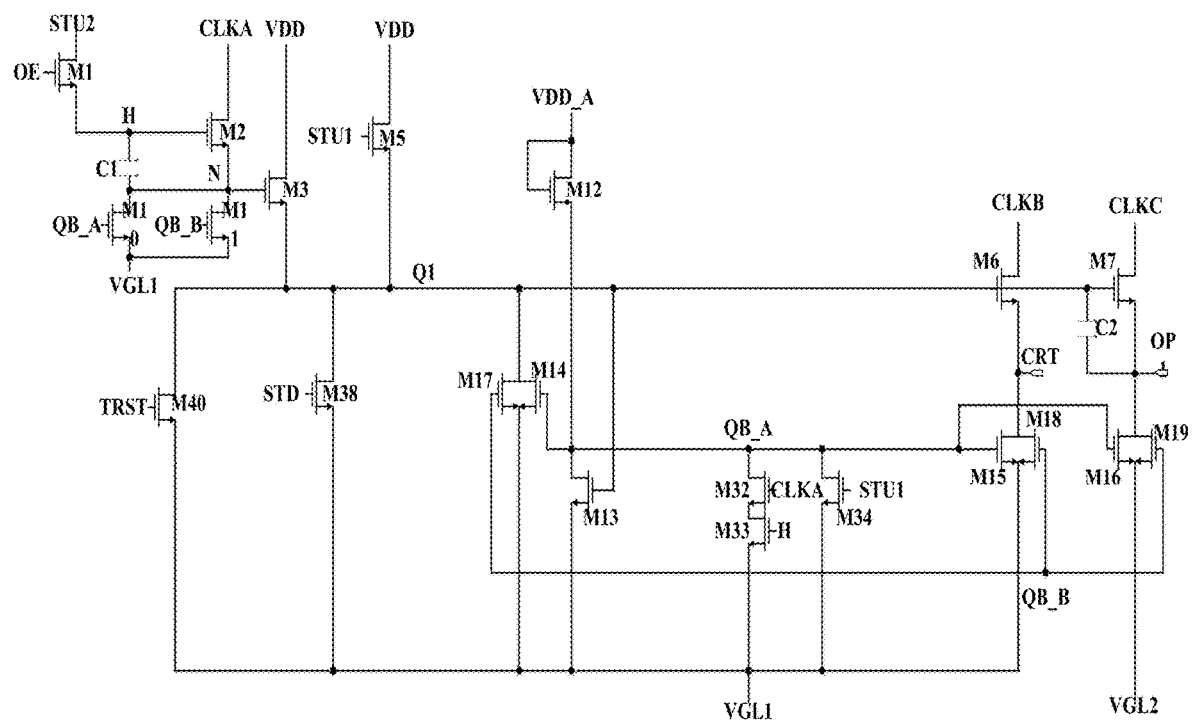
FIGS. 5A and 5B are schematic circuit diagrams of a shift register unit according to an embodiment of the present disclosure.
Figure 5B:
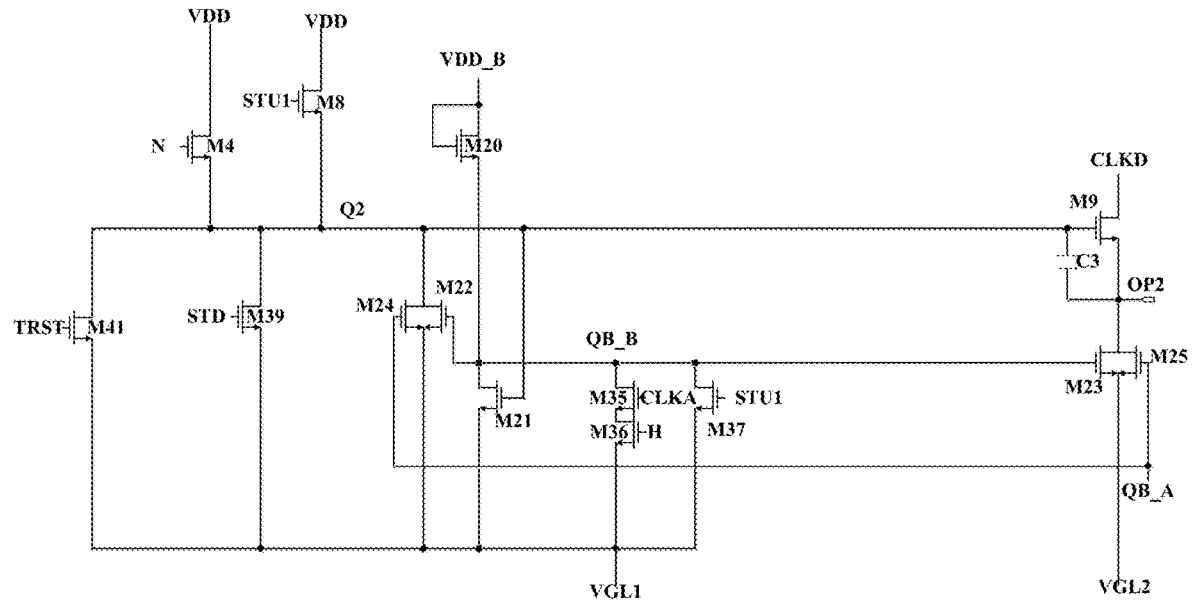

In an embodiment of the present disclosure, the shift register unit may be implemented as the circuit structure shown in FIGS. 5A and 5B. It should be noted that, for clarity of illustration, FIG. 5A shows the first subunit 100 in the shift register unit and a portion of the blanking subunit other than the second transmission circuit 330, and FIG. 5B shows the second transmission circuit 330 and the second subunit 200 in the shift register unit, the circuits in each of FIGS. 5A and 5B are electrically connected through corresponding nodes.

As shown in FIGS. 5A and 5B, the shift register unit includes: transistors from a first transistor M1 to a forty-first transistor M41, a first capacitor C1, a second capacitor C2 and a third capacitor C3. It should be noted that, as an example, the transistors shown in FIGS. 5A and 5B are N-type transistors.

As shown in FIG. 5A, the first input circuit 110 may be implemented as the fifth transistor M5. A gate electrode of the fifth transistor M5 is configured for receiving the first input signal STU1, a first electrode of the fifth transistor M5 is configured for receiving a first voltage VDD, and a second electrode of the fifth transistor M5 is connected with the first node Q1.

As shown in FIG. 5A, the first output circuit 120 may be implemented to include the sixth transistor M6, the seventh transistor M7, and the second capacitor C2. A gate electrode of the sixth transistor M6 is connected with the first node Q1, a first electrode of the sixth transistor M6 is configured for receiving the second clock signal CLKB and use the same as the shift signal CR, and a second electrode of the sixth transistor M6 is connected with a shift signal output terminal CRT and is configured for outputting the shift signal CR.

A gate electrode of the seventh transistor M7 is connected with the first node Q1, a first electrode of the seventh transistor M7 is configured for receiving the third clock signal CLKC and use the same as the first output signal OUT1, and a second electrode of the seventh transistor M7 is connected with a first output signal terminal OP1 and is configured for outputting the first output signal OUT1. A first electrode of the second capacitor C2 is connected with the first node Q1, and a second electrode of the second capacitor C2 is connected with the second electrode (i.e. the first output signal terminal OP1) of the seventh transistor M7.

As shown in FIG. 5B, the second input circuit 210 may be implemented as the eighth transistor M8. A gate electrode of the eighth transistor M8 is configured for receiving the first input signal STU1, a first electrode of the eighth transistor M8 is configured for receiving the first voltage VDD, and a second electrode of the eighth transistor M8 is connected with the second node Q2.

As shown in FIG. 5B, the second output circuit 220 may be implemented to include the ninth transistor M9 and the third capacitor C3. A gate electrode of the ninth transistor M9 is connected with the second node Q2, a first electrode of the ninth transistor M9 is configured for receiving the fourth clock signal CLKD and use the same as a second output signal OUT2, and a second electrode of the ninth transistor M9 is connected with a second output signal terminal OP2 and is configured for outputting the second output signal OUT2. A first electrode of the third capacitor C3 is connected with the second node Q2, and a second electrode of the third capacitor C3 is connected with the second electrode (i.e. the second output signal terminal OP2) of the ninth transistor M9.

As shown in FIG. 5A, the blanking subunit may include the tenth transistor M10 and the eleventh transistor M11. A gate electrode of the tenth transistor M10 is connected with a fifth node QB_A, a first electrode of the tenth transistor M10 is connected with a fourth node N, and a second electrode of the tenth transistor M10 is configured for receiving a fourth voltage VGL1. A gate electrode of the eleventh transistor M11 is connected with a sixth node QB_B, a first electrode of the eleventh transistor M11 is connected with the fourth node N, and a second electrode of the eleventh transistor M11 is configured for receiving the fourth voltage VGL1.

As shown in FIG. 5A, the first subunit may include the twelfth transistor M12 and the thirteenth transistor M13. A gate electrode and a first electrode of the twelfth transistor M12 are configured for receiving the second voltage VDD_A, and a second electrode of the twelfth transistor M12 is connected with the fifth node QB_A. A gate electrode of the thirteenth transistor M13 is connected with the first node Q1, a first electrode of the thirteenth transistor M13 is connected with the fifth node QB_A, and a second electrode of the thirteenth transistor M13 is configured for receiving the fourth voltage VGL1.

As shown in FIG. 5A, the first subunit includes the fourteenth transistor M14, the fifteenth transistor M15 and the sixteenth transistor M16, and the second reset circuit 150 may be implemented to include the seventeenth transistor M17, the eighteenth transistor M18 and the nineteenth transistor M19.

A gate electrode of the fourteenth transistor M14 is connected with the fifth node QB_A, a first electrode of the fourteenth transistor M14 is connected with the first node Q1, and a second electrode of the fourteenth transistor M14 is configured for receiving the fourth voltage VGL1. A gate electrode of the fifteenth transistor M15 is connected with the fifth node QB_A, a first electrode of the fifteenth transistor M15 is connected with the shift signal output terminal CRT, and a second electrode of the fifteenth transistor M15 is configured for receiving the fourth voltage VGL1. A gate electrode of the sixteenth transistor M16 is connected with the fifth node QB_A, a first electrode of the sixteenth transistor M16 is connected with the first output signal terminal OP1, and a second electrode of the sixteenth transistor is configured for receiving a fifth voltage VGL2.

A gate electrode of the seventeenth transistor M17 is connected with the sixth node QB_B, a first electrode of the seventeenth transistor M17 is connected with the first node Q1, and a second electrode of the seventeenth transistor M17 is configured for receiving the fourth voltage VGL1. A gate electrode of the eighteenth transistor M18 is connected with the sixth node QB_B, a first electrode of the eighteenth transistor M18 is connected with the shift signal output terminal CRT, and a second electrode of the eighteenth transistor M18 is configured for receiving the fourth voltage VGL1. A gate electrode of the nineteenth transistor M19 is connected with the sixth node QB_B, a first electrode of the nineteenth transistor M19 is connected with the first output signal terminal OP1, and a second electrode of the nineteenth transistor M19 is configured for receiving the fifth voltage VGL2.

As shown in FIG. 5B, the second subunit may include the twentieth transistor M20 and the twenty-first transistor M21. A gate electrode and a first electrode of the twentieth transistor M20 are configured for receiving the third voltage VDD_B, and a second electrode of the twentieth transistor M20 is connected with the sixth node QB_B. A gate electrode of the twenty-first transistor M21 is connected with the second node Q2, a first electrode of the twenty-first transistor M21 is connected with the sixth node QB_B, and a second electrode of the twenty-first transistor M21 is configured for receiving the fourth voltage VGL1.

As shown in FIG. 5B, the second subunit may include the twenty-second transistor M22 and the twenty-third transistor M23, and a fourth reset circuit 250 may be implemented to include the twenty-fourth transistor M24 and the twenty-fifth transistor M25.

A gate electrode of the twenty-second transistor M22 is connected with the sixth node QB_B, a first electrode of the twenty-second transistor M22 is connected with the second node Q2, and a second electrode of the twenty-second transistor M22 is configured for receiving the fourth voltage VGL1. A gate electrode of the twenty-third transistor M23 is connected with the sixth node QB_B, a first electrode of the twenty-third transistor M23 is connected with the second output signal terminal OP2, and a second electrode of the twenty-third transistor M23 is configured for receiving the fifth voltage VGL2.

A gate electrode of the twenty-fourth transistor M24 is connected with the fifth node QB_A, a first electrode of the twenty-fourth transistor M24 is connected with the second node Q2, and a second electrode of the twenty-fourth transistor M24 is configured for receiving the fourth voltage VGL1. A gate electrode of the twenty-fifth transistor M25 is connected with the fifth node QB_A, a first electrode of the twenty-fifth transistor M25 is connected with the second output signal terminal OP2, and a second electrode of the twenty-fifth transistor M25 is configured for receiving the fifth voltage VGL2.

It should be noted that in the embodiments of the present disclosure, for example, the second voltage VDD_A and the third voltage VDD_B may be configured to be inverted relative to each other; in other words, when the second voltage VDD_A is a high level, the third voltage VDD_B is a low level, and when the second voltage VDD_A is a low level, the third voltage VDD_B is a high level. By adopting this manner, only one of the twelfth transistor M12 and the twentieth transistor M20 is in a conducting state at the same time, so that the performance drift caused by long-term conduction of the transistor can be avoided, and the stability of the circuit can be improved.

As shown in FIG. 5A, the first subunit may include the thirty-second transistor M32 and the thirty-third transistor M33. A gate electrode of the thirty-second transistor M32 is configured for receiving the first clock signal CLKA, a first electrode of the thirty-second transistor M32 is connected with the fifth node QB_A, and a second electrode of the thirty-second transistor M32 is connected with a first electrode of the thirty-third transistor M33. A gate electrode of the thirty-third transistor M33 is connected with the third node H, and a second electrode of the thirty-third transistor M33 is configured for receiving the fourth voltage VGL1.

The first subunit may include the thirty-fourth transistor M34. A gate electrode of the thirty-fourth transistor M34 is configured for receiving the first input signal STU1, a first electrode of the thirty-fourth transistor M34 is connected with the fifth node QB_A, and a second electrode of the thirty-fourth transistor M34 is configured for receiving the fourth voltage VGL1.

As shown in FIG. 5B, the second subunit may include the thirty-fifth transistor M35 and the thirty-sixth transistor M36. A gate electrode of the thirty-fifth transistor M35 is configured for receiving the first clock signal CLKA, a first electrode of the thirty-fifth transistor M35 is connected with the sixth node QB_B, and a second electrode of the thirty-fifth transistor M35 is connected with a first electrode of the thirty-sixth transistor M36. A gate electrode of the thirty-sixth transistor M36 is connected with the third node H, and a second electrode of the thirty-sixth transistor M36 is configured for receiving the fourth voltage VGL1.

The second subunit may include the thirty-seventh transistor M37. A gate electrode of the thirty-seventh transistor M37 is configured for receiving the first input signal STU1, a first electrode of the thirty-seventh transistor M37 is connected with the sixth node QB_B, and a second electrode of the thirty-seventh transistor M37 is configured for receiving the fourth voltage VGL1.

As shown in FIG. 5A, the first subunit may include the thirty-eighth transistor M38 and the fortieth transistor M40. A gate electrode of the thirty-eighth transistor M38 is configured for receiving the display reset signal STD, a first electrode of the thirty-eighth transistor M38 is connected with the first node Q1, and a second electrode of the thirty-eighth transistor M38 is configured for receiving the fourth voltage VGL1. A gate electrode of the fortieth transistor M40 is configured for receiving the global reset signal TRST, a first electrode of the fortieth transistor M40 is connected with the first node Q1, and a second electrode of the fortieth transistor M40 is configured for receiving the fourth voltage VGL1.

As shown in FIG. 5B, the second subunit may include the thirty-ninth transistor M39 and the forty-first transistor M41. A gate electrode of the thirty-ninth transistor M39 is configured for receiving the display reset signal STD, a first electrode of the thirty-ninth transistor M39 is connected with the second node Q2, and a second electrode of the thirty-ninth transistor M39 is configured for receiving the fourth voltage VGL1. A gate electrode of the forty-first transistor M41 is configured for receiving the global reset signal TRST, a first electrode of the forty-first transistor M41 is connected with the second node Q2, and a second electrode of the forty-first transistor M41 is configured for receiving the fourth voltage VGL1.

Figure 6:
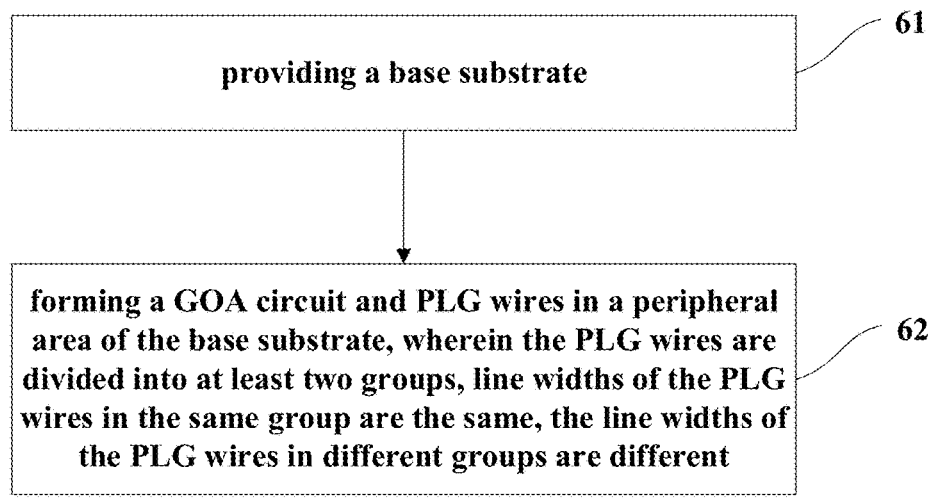
FIG. 6 is a flow diagram of a method for manufacturing a display substrate according to an embodiment of the present disclosure.

Referring to FIG. 6, the present disclosure further provides a method for manufacturing an array substrate, including: a step 61 of providing a base substrate; a step 62 of forming a GOA circuit, a source electrode integrated circuit and PLG wires in a peripheral area of the base substrate, wherein the PLG wires are configured for connecting the GOA circuit with the source electrode integrated circuit, the PLG wires are divided into at least two groups, line widths of the PLG wires in the same group are the same, the line widths of the PLG wires in different groups are different, the GOA signal includes a cascade signal and a non-cascade signal; the at least two groups includes a first PLG wiring group and at least one second PLG wiring group, the first PLG wiring group transmits the cascade signal, the second PLG wiring group transmits the non-cascade signal, a line width of the first PLG wiring group is smaller than a line width of the second PLG wiring group, and the first PLG wiring group is located at a side of the second PLG wiring group distal to an active area of the base substrate.

Optionally, the PLG wires in the same group are formed in the same area, and the PLG wires in different groups are formed in different areas.

Optionally, the PLG wires in different groups are configured for transmitting the GOA signals of different types.

Optionally, the non-cascade signal includes: a driving signal and a control signal; and there is one second PLG wire group, the second PLG wire group includes a second PLG wire and a third PLG wire, the second PLG wire is configured for transmitting the driving signal, and the third PLG wire is configured for transmitting the control signal.

Optionally, the PLG wires in a same group are configured for transmitting the GOA signals of a same type.

Optionally, the non-cascade signal includes: a driving signal and a control signal; and there are two second PLG wire groups, wherein one of the second PLG wire groups includes a second PLG wire, the other one of the second PLG wire groups includes a third PLG wire, the second PLG wire is configured for transmitting the driving signal, and the third PLG wire is configured for transmitting the control signal.

Optionally, a line width of the third PLG wire is smaller than a line width of the second PLG wire.

Optionally, the third PLG wire is located at a side of the second PLG wire proximate to the active area.

Optionally, the GOA circuit includes a plurality of cascaded shift register units and a blanking input subunit; the blanking input subunit includes: a common input circuit, a first transmission circuit and a second transmission circuit; each of the cascaded shift register units includes a first subunit and a second subunit, the first subunit includes a first input circuit and a first output circuit, the first input circuit is configured for controlling an electric level at a first node in response to a first input signal, the first output circuit is configured for outputting a shift signal and a first output signal under control of the electric level at the first node, the second subunit includes a second input circuit and a second output circuit, the second input circuit is configured for controlling an electric level at a second node in response to the first input signal, and the second output circuit is configured for outputting a second output signal under control of the electric level at the second node; and the common input circuit is configured for controlling an electric level at a third node in response to a selection control signal; the first transmission circuit is electrically connected with the first node and the third node, and is configured for controlling the electric level at the first node under control of the electric level at the third node or a first transmission signal; and the second transmission circuit is electrically connected with the second node and the third node, and is configured for controlling the electric level at the second node under the control of the electric level at the third node or a second transmission signal.

Optionally, the cascade signal includes: a fourth clock signal; the GOA circuit includes: a fifth sub-clock signal line, a seventh sub-clock signal line and a ninth sub-clock signal line; a PLG wire in the first PLG wire group is a first PLG wire; the fifth sub-clock signal line is connected with a second subunit in a $(3n-2)^{th}$-stage shift register unit, and is connected with the first PLG wire, to transmit the fourth clock signal; the seventh sub-clock signal line is connected with a second subunit in a $(3n-1)^{th}$-stage shift register unit, and is connected with the first PLG wire, to transmit the fourth clock signal; the ninth sub-clock signal line is connected with a second subunit in a $3n^{th}$-stage shift register unit, and is connected with the first PLG wire, to transmit the fourth clock signal, wherein n is an integer greater than zero.

Optionally, the driving signal includes: a first clock signal, a second clock signal and a third clock signal; the GOA circuit includes: a first sub-clock signal line, a second sub-clock signal line, a third sub-clock signal line, a fourth sub-clock signal line, a sixth sub-clock signal line, an eighth sub-clock signal line and a twelfth sub-clock signal line; when there are two second PLG wire groups, a PLG wire in one of the second PLG wire groups is the second PLG wire; the first sub-clock signal line is connected with a first subunit in a $(3n-2)^{th}$-stage shift register unit, and is connected with the second PLG wire, to transmit the second clock signal; the second sub-clock signal line is connected with a first subunit in a $(3n-1)^{th}$-stage shift register unit, and is connected with the second PLG wire, to transmit the second clock signal; the third sub-clock signal line is connected with a first subunit in a $3n^{th}$-stage shift register unit, and is connected with the second PLG wire, to transmit the second clock signal; the fourth sub-clock signal line is connected with the first subunit in the $(3n-2)^{th}$-stage shift register unit, and is connected with the second PLG wire, to transmit the third clock signal; the sixth sub-clock signal line is connected with the first subunit in the $(3n-1)^{th}$-stage shift register unit, and is connected with the second PLG wire, to transmit the third clock signal; the eighth sub-clock signal line is connected with the first subunit in the 3e-stage shift register unit, and is connected with the second PLG wire, to transmit the third clock signal; the twelfth sub-clock signal line is connected with the first subunit and the second subunit in the shift register unit of each stage, and the common input circuit, and is connected with the second PLG wire, to transmit the first clock signal; n is an integer greater than zero.

Optionally, the control signal includes: a global reset signal, a selection control signal, a second voltage, a third voltage and a first input signal; the GOA circuit includes: a tenth sub-clock signal line, an eleventh sub-clock signal line, a thirteenth sub-clock signal line, a fourteenth sub-clock signal line and a fifteenth sub-clock signal line; when there are two second PLG wire groups, a PLG wire in the other one of the second PLG wire groups is the third PLG wire; the tenth sub-clock signal line is connected with the first subunit and the second subunit, and is connected with the third PLG wire, to transmit the global reset signal; the eleventh sub-clock signal line is connected with the common input circuit, and is connected with the third PLG wire, to transmit the selection control signal; the thirteenth sub-clock signal line is connected with the first subunit, and is connected with the third PLG wire, to transmit the second voltage; the fourteenth sub-clock signal line is connected with the second subunit, and is connected with the third PLG wire, to transmit the third voltage; the fifteenth sub-clock signal line is connected with the first subunit and the second subunit, and is connected with the third PLG wire, to transmit the first input signal.

An embodiment of the present disclosure further provides a display device including the display substrate in any one of the above-mentioned embodiments. The display device may be a display panel or a display including a display panel and a driving circuit.

In the embodiment of the present disclosure, the display device may be an Active Matrix Organic Light Emitting Display (AMOLED) or another type of display device.

The embodiments of the present disclosure have been described above with reference to the accompanying drawings, but the present disclosure is not limited to the specific embodiments described above, which are for illustration purpose only, instead of being limiting. Many forms can be made by a person skilled in the art in light of the present disclosure without departing from the spirit of the present disclosure and the scope of protection of the claims, and shall also fall within the protection of the present disclosure.

What is claimed is:

1. An array substrate, comprising a base substrate, a Gate driver On Array (GOA) circuit, a source electrode integrated circuit and Propel Link Gate (PLG) wires, wherein the GOA circuit, the source electrode integrated circuit and the PLG wires are arranged in a peripheral area of the base substrate, and the PLG wires are configured for connecting the GOA circuit with the source electrode integrated circuit;
   the GOA circuit is configured for transmitting a GOA signal, and the GOA signal comprises a cascade signal and a non-cascade signal;
   the PLG wires comprise a first PLG wire group and at least one second PLG wire group, wherein the first PLG wire group is configured for transmitting the cascade signal, the second PLG wire group is configured for transmitting the non-cascade signal, a line width of the first PLG wire group is smaller than a line width of the second PLG wire group, and the first PLG wire group is located at a side of the second PLG wire group that is distal to an active area of the base substrate,
   wherein the line widths of the PLG wires in a same group are same, the line widths of the PLG wires in different groups are different, and the PLG wires in different groups are configured for transmitting the GOA signals of different types,
   wherein the non-cascade signal comprises: a driving signal and a control signal;
   there is one second PLG wire group, the second PLG wire group comprises a second PLG wire and a third PLG wire, the second PLG wire is configured for transmitting the driving signal, and the third PLG wire is configured for transmitting the control signal.

2. The array substrate of claim 1, wherein the PLG wires in a same group are arranged in a same area, and the PLG wires in different groups are arranged in different areas.

3. The array substrate of claim 1, wherein the PLG wires in a same group are configured for transmitting the GOA signals of a same type.

4. The array substrate of claim 3, wherein the non-cascade signal comprises a driving signal and a control signal;
   there are two second PLG wire groups, wherein one of the second PLG wire groups comprises a second PLG wire, the other one of the second PLG wire groups comprises a third PLG wire, the second PLG wire is configured for transmitting the driving signal, and the third PLG wire is configured for transmitting the control signal.

5. The array substrate of claim 4, wherein
   a line width of the third PLG wire is smaller than a line width of the second PLG wire.

6. The array substrate of claim 1, wherein
   the third PLG wire is located at a side of the second PLG wire proximate to the active area.

7. The array substrate of claim 1, wherein
   the GOA circuit comprises a plurality of cascaded shift register units and a blanking input subunit;

each of the cascaded shift register units comprises a first subunit and a second subunit, the first subunit comprises a first input circuit and a first output circuit, the first input circuit is configured for controlling an electric level at a first node in response to a first input signal, the first output circuit is configured for outputting a shift signal and a first output signal under control of the electric level at the first node, the second subunit comprises a second input circuit and a second output circuit, the second input circuit is configured for controlling an electric level at a second node in response to the first input signal, and the second output circuit is configured for outputting a second output signal under control of the electric level at the second node;

the blanking input subunit comprises: a common input circuit, a first transmission circuit and a second transmission circuit; and the common input circuit is configured for controlling an electric level at a third node in response to a selection control signal; the first transmission circuit is electrically connected with the first node and the third node, and is configured for controlling the electric level at the first node under control of the electric level at the third node or a first transmission signal; and the second transmission circuit is electrically connected with the second node and the third node, and is configured for controlling the electric level at the second node under the control of the electric level at the third node or a second transmission signal.

8. The array substrate of claim 7, wherein
the cascade signal comprises a fourth clock signal;
the GOA circuit comprises: a fifth sub-clock signal line, a seventh sub-clock signal line and a ninth sub-clock signal line;
a PLG wire in the first PLG wire group is the first PLG wire;
the fifth sub-clock signal line is connected with a second subunit in a $(3n-2)^{th}$-stage shift register unit, and is connected with the first PLG wire, to transmit the fourth clock signal;
the seventh sub-clock signal line is connected with a second subunit in a $(3n-1)^{th}$-stage shift register unit, and is connected with the first PLG wire, to transmit the fourth clock signal;
the ninth sub-clock signal line is connected with a second subunit in a $3n^{th}$-stage shift register unit, and is connected with the first PLG wire, to transmit the fourth clock signal, wherein n is an integer greater than zero.

9. The array substrate of claim 7, wherein
the driving signal comprises: a first clock signal, a second clock signal and a third clock signal;
the GOA circuit comprises: a first sub-clock signal line, a second sub-clock signal line, a third sub-clock signal line, a fourth sub-clock signal line, a sixth sub-clock signal line, an eighth sub-clock signal line and a twelfth sub-clock signal line;
when there are two second PLG wire groups, a PLG wire in one of the second PLG wire groups is the second PLG wire;
the first sub-clock signal line is connected with a first subunit in a $(3n-2)^{th}$-stage shift register unit, and is connected with the second PLG wire, to transmit the second clock signal;
the second sub-clock signal line is connected with a first subunit in a $(3n-1)^{t}$-stage shift register unit, and is connected with the second PLG wire, to transmit the second clock signal;

the third sub-clock signal line is connected with a first subunit in a 3e-stage shift register unit, and is connected with the second PLG wire, to transmit the second clock signal;
the fourth sub-clock signal line is connected with the first subunit in the $(3n-2)^{th}$-stage shift register unit, and is connected with the second PLG wire, to transmit the third clock signal;
the sixth sub-clock signal line is connected with the first subunit in the $(3n-1)^{t}$-stage shift register unit, and is connected with the second PLG wire, to transmit the third clock signal;
the eighth sub-clock signal line is connected with the first subunit in the 3e-stage shift register unit, and is connected with the second PLG wire, to transmit the third clock signal;
the twelfth sub-clock signal line is connected with the first subunit and the second subunit in the shift register unit of each stage, and the common input circuit, and is connected with the second PLG wire, to transmit the first clock signal;
n is an integer greater than zero.

10. The array substrate of claim 7, wherein
the control signal comprises: a global reset signal, a selection control signal, a second voltage, a third voltage and a first input signal;
the GOA circuit comprises: a tenth sub-clock signal line, an eleventh sub-clock signal line, a thirteenth sub-clock signal line, a fourteenth sub-clock signal line and a fifteenth sub-clock signal line;
when there are two second PLG wire groups, a PLG wire in the other one of the second PLG wire groups is the third PLG wire;
the tenth sub-clock signal line is connected with the first subunit and the second subunit, and is connected with the third PLG wire, to transmit the global reset signal;
the eleventh sub-clock signal line is connected with the common input circuit, and is connected with the third PLG wire, to transmit the selection control signal;
the thirteenth sub-clock signal line is connected with the first subunit, and is connected with the third PLG wire, to transmit the second voltage;
the fourteenth sub-clock signal line is connected with the second subunit, and is connected with the third PLG wire, to transmit the third voltage;
the fifteenth sub-clock signal line is connected with the first subunit and the second subunit, and is connected with the third PLG wire, to transmit the first input signal.

11. A display device comprising the array substrate of claim 1.

12. The display device of claim 11, wherein the PLG wires in a same group are arranged in a same area, and the PLG wires in different groups are arranged in different areas.

13. The display device of claim 11, wherein the PLG wires in a same group are configured for transmitting the GOA signals of a same type.

14. The display device of claim 13, wherein the non-cascade signal comprises a driving signal and a control signal;
there are two second PLG wire groups, wherein one of the second PLG wire groups comprises a second PLG wire, the other one of the second PLG wire groups comprises a third PLG wire, the second PLG wire is configured for transmitting the driving signal, and the third PLG wire is configured for transmitting the control signal.

15. The display device of claim 14, wherein
a line width of the third PLG wire is smaller than a line width of the second PLG wire.

16. A method for manufacturing an array substrate, comprising:
providing a base substrate; and
forming a GOA circuit, a source electrode integrated circuit and PLG wires in a peripheral area of the base substrate, wherein the PLG wires are configured for connecting the GOA circuit with the source electrode integrated circuit, the PLG wires comprise a first PLG wire group and at least one second PLG wire group, the first PLG wire group is configured for transmitting a cascade signal, the second PLG wire group is configured for transmitting a non-cascade signal, a line width of the first PLG wire group is smaller than a line width of the second PLG wire group, and the first PLG wire group is located at a side of the second PLG wire group that is distal to an active area of the base substrate,
wherein the line widths of the PLG wires in a same group are same, the line widths of the PLG wires in different groups are different, and the PLG wires in different groups are configured for transmitting the GOA signals of different types,
wherein the non-cascade signal comprises: a driving signal and a control signal;
there is one second PLG wire group, the second PLG wire group comprises a second PLG wire and a third PLG wire, the second PLG wire is configured for transmitting the driving signal, and the third PLG wire is configured for transmitting the control signal.

* * * * *